United States Patent
Pal

(10) Patent No.: US 8,421,513 B2
(45) Date of Patent: Apr. 16, 2013

(54) MASTER-SLAVE FLIP-FLOP CIRCUIT

(75) Inventor: Sumana Pal, Bangalore (IN)

(73) Assignee: ARM Limited, Cambridge (GB)

( * ) Notice: Subject to any disclaimer, the term of this patent is extended or adjusted under 35 U.S.C. 154(b) by 65 days.

(21) Appl. No.: 13/067,452

(22) Filed: Jun. 1, 2011

(65) Prior Publication Data
US 2011/0298517 A1 Dec. 8, 2011

Related U.S. Application Data

(60) Provisional application No. 61/351,203, filed on Jun. 3, 2010.

(51) Int. Cl.
*H03K 3/289* (2006.01)
(52) U.S. Cl.
USPC ............ 327/202; 327/199; 327/200; 327/201
(58) Field of Classification Search .................. 327/161, 327/185, 199–203, 208–212, 214, 215, 218
See application file for complete search history.

(56) References Cited

U.S. PATENT DOCUMENTS

| | | | | |
|---|---|---|---|---|
| 5,831,463 | A * | 11/1998 | Sachdev | 327/202 |
| 6,246,265 | B1 * | 6/2001 | Ogawa | 326/95 |
| 6,492,854 | B1 * | 12/2002 | Ku et al. | 327/202 |
| 2006/0152268 | A1 * | 7/2006 | Flynn et al. | 327/218 |
| 2007/0103217 | A1 * | 5/2007 | Frederick et al. | 327/218 |
| 2011/0248759 | A1 * | 10/2011 | Chi et al. | 327/202 |
| 2012/0229187 | A1 * | 9/2012 | Choudhury et al. | 327/202 |

OTHER PUBLICATIONS

U.S. Appl. No. 12/929,071, filed Dec. 28, 2010, Pal et al.
Tufekcic, "Control Power ARM PMK and Cadence Low Power Flow", www.iqmagazineonline.com, May 2007, 25 pages.
Mahmoodi-Meimand et al., "Data-Retention Flip-Flops for Power-Down Applications", *2004 IEEE*, (No Date), pp. II-677-II-680.
Shi, "Area and Power-Delay Efficient State Retention Pulse-triggered Flip-flops with Scan and Reset Capabilities", *2008 IEEE*, (No Date) pp. 170-175.
Zhao et al., "External-Internal Dual Switch Leakage Controlled Flip-Flop", *Ctr. for Advanced Computer Studies*, (No Date), pp. 1-20.
Bai et al., "Fault Modeling and Testing of Retention Flip-Flops in Lower Power Designs", *2009 IEEE*, (No Date) pp. 684-689.
Henzler et al., "Dynamic State-Retention Flip-Flop for Fine-Grained Power Gating With Small Design and Power Overhead", *IEEE Journal of Solid-State Circuits*, vol. 41, No. 7, Jul. 2006, pp. 1654-1661.
Keating et al., "Low Power Methodology Manual for System-On-Chip Design", *Springer*, 2007, pp. 210-218.

* cited by examiner

*Primary Examiner* — Lincoln Donovan
*Assistant Examiner* — Brandon S Cole
(74) *Attorney, Agent, or Firm* — Nixon & Vanderhye P.C.

(57) ABSTRACT

A master-slave flip-flop circuit comprises a master stage for retaining a master signal, a slave stage for retaining a slave signal and a retention stage. During a normal mode of operation, the retention stage captures a retention signal having a value dependent upon the slave signal. During a retention mode of operation, the retention stage isolates the retention signal from changes in the stage signal and retains the retention signal. During the retention mode the retention stage also provides a master restore signal to the master stage and provides a slave restore signal to the slave stage. The master restore signal and the slave restore signal have values dependent on the retention signal for configuring the master stage and slave stage such that the master and slave signals have values corresponding to the retention signal.

22 Claims, 16 Drawing Sheets

MASTER-SLAVE FLIP-FLOP CIRCUIT

This application claims priority to U.S. Provisional Application No. 61/351,203, filed Jun. 3, 2010, the entire content of which is hereby incorporated by reference.

BACKGROUND OF THE INVENTION

1. Field of the Invention

This invention relates to the field of master-slave flip-flop circuits. More particularly, this invention relates to master-slave retention flip-flop circuits which operate in a normal mode controlled by a clock signal and in a retention mode in which the slave state is maintained and less power consumed.

2. Description of the Prior Art

FIG. 1 of the accompanying drawings illustrates one known master-slave retention flip-flop circuit. In this circuit the received clock signal ck is combined in an AND gate N1C with a retention signal RETN to produce the local clock signals cn and c which are used to control the master/slave retention flip-flop circuit. When the retention signal input to the AND gate N1C goes low, the local clock signals supplied to the flip-flop are held static and so the data output by the slave stage of the flip-flop remains constant.

A problem with this circuit is that, if the clock signal input to the AND gate N1C is high and the retention signal goes from low to high, then there will be a transition in the local clock signals cn and c which control the flip-flop circuitry. This is functionally incorrect as the output of the flip-flop circuit should not change when the clock signal input to the AND gate N1C is steady.

FIG. 2 of the accompanying drawings illustrates another known design of a master-slave retention flip-flop circuit. The operation of this circuit is such that, if the clock signal CK is high, then the retained data within the retention latch (dark inverters) will pass to the output Q and the output of the master stage will be blocked by the tri-state inverter in the master latch.

A problem with this circuit is, if the clock signal CK is low and a local power up occurs while in the retention mode, then the value driven to the output Q is not well defined.

An object of the present invention is to provide a clock independent master-slave flip-flop circuit that has correct functional behaviour for a flip-flop and a well defined output independent of the clock signal level.

SUMMARY OF THE INVENTION

Viewed from one aspect, the present invention provides a master-slave flip-flop circuit for receiving an input signal and for generating an output signal, said master-slave flip-flop circuit being controlled by a clock signal having a first phase and a second phase, said master-slave flip-flop circuit having a normal mode of to operation and a retention mode of operation, said master-slave flip flop circuit comprising:

a master stage configured; during said normal mode, to (i) capture a master signal at a master node during said first phase of said clock signal, said master signal having a value dependent on said input signal, and (ii) retain said master signal at said master node during said second phase of said clock signal;

a slave stage configured, during said normal mode, to (i) capture a slave signal at a slave node during said second phase of said clock signal, said slave signal having a value dependent on said master signal, and (ii) retain said slave signal at said slave node during said first phase of said clock signal, said output signal having a value dependent on said slave signal;

an input isolation circuit configured to isolate said master stage from said changes in said input signal during said retention mode; and a retention stage coupled to said master stage and said slave stage and configured:

(i) during said normal mode, to capture a retention signal at a retaining node, said retention signal having a value dependent on said slave signal; and (ii) during said retention mode, to isolate said retaining node from changes in said slave signal, to retain said retention signal at said retaining node, to provide a master restore signal to a master restore node of said master stage and to provide a slave restore signal to a slave restore node of said slave stage, said master restore signal and slave restore signal having values, dependent on said retention signal, for configuring said master stage and said slave stage such that said master signal and said slave signal have values corresponding to said retention signal.

The master-slave flip-flop circuit is provided with a retention stage which during the normal mode captures a retention signal having a value dependent on the slave signal, and during the retention mode retains the retention signal. During the retention mode, the master stage and slave stage can be powered down without affecting the retention signal retained in the retention stage. Before returning to the normal mode, the master stage and slave stage can be powered up again, at which point they can be reconfigured by the retention stage. Input isolation circuitry is provided to isolate the master stage from changes in the input signal during the retention mode, so that the retention stage can reconfigure the master and slave stages without conflicting with the input signal.

To ensure that the master stage and slave stage, and hence the output signal, are set to the appropriate state irrespective of whether the clock signal is at the first phase or second phase at the time of returning to the normal mode, the retention stage provides, during the retention mode, restore signals to both the master stage and the slave stage. A master restore signal is provided to a master restore node of the master restore stage and a slave restore signal is provided to a slave restore node of the slave stage. The master restore signal and slave restore signal have values, dependent on the retention signal, for configuring the master stage and slave stage such that the master signal and slave signal correspond to the retention signal (i.e. correspond to the state of the flip-flop at the time of entry to the retention mode).

Since both the master stage and the slave stage are reinitialised by the restore signals, the return to normal mode results in a well defined output signal, independently of whether the clock is at the first phase or the second phase, unlike the circuit of FIG. 2 as described above. This simplifies control of the operational mode of the flip-flop, since it is not necessary to ensure that the flip-flop returns to normal mode in a particular clock phase.

The circuit may comprise power control circuitry configured to selectively place at least the master stage and the slave stage in a power saving state during the retention mode. Hence, power consumption can be reduced during the retention mode. The retention stage may be powered separately from the master stage and slave stage, so that during the retention mode the retention stage remains powered and retains the retention signal.

Preferably, the power control circuitry may be configured to place at least the master stage and slave stage in the power saving state after the master-slave flip-flop circuit has entered the retention mode, and to bring at least the master stage and slave stage out of the power saving state before the master-stage flip-flop circuit returns to the normal mode. This ensures that, on entry to retention mode, the retention stage captures the retention signal before the master stage and slave stage are powered to down, and that the master stage and slave stage are reinitialised based on the master restore signal and slave restore signal before returning to the normal mode.

The retention stage may comprise retention input circuitry configured to propagate changes in the slave signal to the retaining node during the normal mode and to isolate the retaining node from changes in the slave signal during the retention mode. The retention input circuitry allows the retention stage to capture the retention signal based on the slave signal during the normal mode, and ensures that changes in the slave signal do not affect the value of the retention signal during the retention mode. This means that if the slave stage is powered down during the retention mode then the retention stage continues to store the retention signal. The retention input circuitry may comprise, for example, a tri-state inverter, a pass gate (also known as a transmission gate), or another kind of gating circuit.

The retention stage may comprise master restore output circuitry configured to isolate the master restore node from the master restore signal during the normal mode and to propagate the master restore signal to the master restore mode during the retention mode. Hence, during the normal mode, the master restore signal is not provided to the master stage so that the retention signal does not affect the normal operation of the master stage. On the other hand, in the retention mode the master restore output circuitry allows the master restore signal to be propagated to the master stage so that, when power is provided to the master stage, the master stage is reconfigured based on the master restore signal. Again, the master restore output circuitry may comprise a pass gate or a tristate inverter.

Similarly, the retention stage may comprise slave restore output circuitry configured in a corresponding way to the master restore output circuitry to control the supply of the slave restore signal to the slave stage.

The master-slave flip-flop may also comprise master-slave isolation circuitry configured, during at least the normal mode, to isolate the slave node from the master node during the first phase of the clock signal and to propagate the master signal from the master node to the slave node during the second phase of the clock signal. Hence, the master-slave isolation circuitry allows the slave stage to capture the master signal during the second phase of the clock signal but not the first phase of the clock signal.

The input isolation circuit may be implemented by various circuits, such as a transmission gate for example. However, in one particularly efficient embodiment the input isolation circuit may comprise a tri-state inverter configured to operate in a low-impedance state during the normal mode and to operate in a high-impedance state during the retention mode. Hence, during the retention mode the input isolation circuit prevents changes in the input signal affecting the state of the master stage.

The master-slave flip-flop circuit may optionally have a scan mode of operation in addition to the normal mode and the retention mode. In this case, the input isolation circuit may be configured to:
(i) propagate changes in the input signal to the master stage during the normal mode;
(ii) propagate changes in a scan input signal to the master stage during the scan mode such that the master signal has a value dependent on the scan input signal; and
(iii) isolate the master stage from changes in the input signal and the scan input signal during the retention mode.

Hence, the input isolation circuit may act as a selector which propagates changes in the input signal and the scan input signal to the master stage during the normal mode and scan mode respectively, and isolates the master stage from changes in both the input signal and the scan input signal during the retention mode to allow the master stage to be re-initialised based on the master restore signal. Typically, the scan mode is used during circuit testing to drive the master-slave flip-flop circuit with a predetermined scan input signal.

The master-slave flip-flop may optionally include at least one of a reset mechanism and a set mechanism.

The reset mechanism may be configured to receive a reset control signal and, in response to the reset control signal indicating a resetting event, to reset the master signal and slave signal to values such that the output signal has a low logic value. Hence, the reset mechanism can be used to clear the current state of the flip-flop.

In one embodiment of the reset mechanism, the retention stage may be configured to continue retaining the retention signal when the reset control signal indicates the resetting event during the retention mode. Hence, when the circuit is subsequently returns to the normal mode, the master and slave stages may be reconfigured based on the master and slave restore signals to return to their state at the time of entry into the retention mode (before the resetting event took place). To ensure that the slave stage maintains its reset value during the resetting event while the retention stage maintains the retention signal, the retention stage may be configured, in response to the reset control signal indicating the resetting event during the retention mode, to prevent the slave stage from being reconfigured in response to the slave restore signal. For example, the slave restore output circuit may enter a non-conductive or high-impedance state during the retention mode. This allows the retention stage to continue storing the retention signal without affecting the state of the slave stage during the resetting event.

Alternatively, the reset mechanism may be such that the retention stage is configured to reset the retention signal to a reset value when the reset control signal indicates the resetting event during retention mode. In this case, then the retention stage is reset along with the master stage and slave stage. This mechanism can be more area efficient than the mechanism in which the retention signal is retained during the resetting event. Various circuit structures may be used to implement the resetting of the retention stage during the resetting event. However, in one particularly efficient example, the flip-flop circuit may be configured to return to normal mode if the reset control signal indicates the resetting event while the flip-flop circuit is operating in the retention mode. By returning to the normal mode, the retention stage will be configured to capture the slave signal from the slave stage and update the retention signal based on the slave signal, and so resetting the slave stage will also cause the retention stage to be reset.

Similarly, the circuit may comprise a set mechanism configured to receive a set control signal and, in response to the set control signal indicating a setting event, to set the master signal and the slave signal to values such that the output signal has a high logic value. The set mechanism is similar to the reset mechanism, except that it forces the output to a high logic value instead of a low logic value.

In a similar way to reset mechanism, the set mechanism may be arranged either such that the retention stage retains its retention signal during the setting event or such that the retention stage is set to a set value together with the master stage and slave stage. The implementation of such set mechanisms may be similar to the reset mechanism.

In another embodiment, the master-slave flip-flop circuit may comprise both a reset and a set mechanism, with one of the set mechanism and reset mechanism taking precedence over the other such that if the set control signal indicates the setting event simultaneously with the reset control signal indicating the resetting event, then the master signal and slave signal are set to values such that the output signal has a logic value corresponding to the preferred one of the reset and set mechanism. Again, in the set/reset embodiment, the retention stage may retain its retention signal during set/reset (with the slave stage being prevented from being reconfigured in response to the slave restore signal during the resetting or setting event), or may be set or reset along with the master stage or slave stage (for example, by entering the normal mode on occurrence of the resetting or setting event).

Viewed from another aspect, the present invention provides a master-slave flip-flop circuit for receiving an input signal and for generating an output signal, said master-slave flip-flop circuit being controlled by a clock signal having a first phase and a second phase, said master-slave flip-flop circuit having a normal mode of operation and a retention mode of operation, said master-slave flip flop circuit comprising:

master stage means for, during said normal mode, (i) capturing a master signal at a master node during said first phase of said clock signal, said master signal having a value dependent on said input signal, and (ii) retaining said master signal at said master node during said second phase of said clock signal;

slave stage means for, during said normal mode, (i) capturing a slave signal at a slave node during said second phase of said clock signal, said slave signal having a value dependent on said master signal, and (ii) retaining said slave signal at said slave node during said first phase of said clock signal, said output signal having a value dependent on said slave signal;

input isolation means for isolating said master stage means from said changes in said input signal during said retention mode; and retention stage means, coupled to said master stage means and said slave stage means, for:
(i) during said normal mode, capturing a retention signal at a retaining node, said retention signal having a value dependent on said slave signal; and
(ii) during said retention mode, isolating said retaining node from changes in said slave signal, retaining said retention signal at said retaining node, providing a master restore signal to a master restore node of said master stage means and providing a slave restore signal to a slave restore node of said slave stage means, said master restore signal and slave restore signal having values, dependent on said retention signal, for configuring said master stage means and said slave stage means such that said master signal and said slave signal have values corresponding to said retention signal.

Viewed from yet another aspect, the present invention provides a method of operating a master-slave flip-flop circuit for receiving an input signal and for generating an output signal, said master-slave flip-flop circuit being controlled by a clock signal having a first phase and a second phase, said master-slave flip-flop circuit having a normal mode of operation and a retention mode of operation, said method comprising:
(i) during said normal mode of operation:
   (a) capturing a master signal at a master node of a master stage during said first phase of said clock signal, said master signal having a value dependent on said input signal,
   (b) retaining said master signal at said master node during said second phase of said clock signal;
   (c) capturing a slave signal at a slave node of a slave stage during said second phase of said clock signal, said slave signal having a value dependent on said master signal;
   (d) retaining said slave signal at said slave node during said first phase of said to clock signal, said output signal having a value dependent on said slave signal; and
   (e) capturing a retention signal at a retaining node of a retention stage, said retention signal having a value dependent on said slave signal; and
(ii) during said retention mode of operation:
   (a) isolating said master stage from said changes in said input signal during said retention mode;
   (b) isolating said retaining node from changes in said slave signal;
   (c) retaining said retention signal at said retaining node;
   (d) providing a master restore signal to a master restore node of said master stage; and
   (e) providing a slave restore signal to a slave restore node of said slave stage;
said master restore signal and slave restore signal having values, dependent on said retention signal, for configuring said master stage and said slave stage such that said master signal and said slave signal have values corresponding to said retention signal.

The above, and other objects, features and advantages of this invention will be apparent from the following detailed description of illustrative embodiments which is to be read in connection with the accompanying drawings.

DESCRIPTION OF THE EMBODIMENTS

Figure 1:
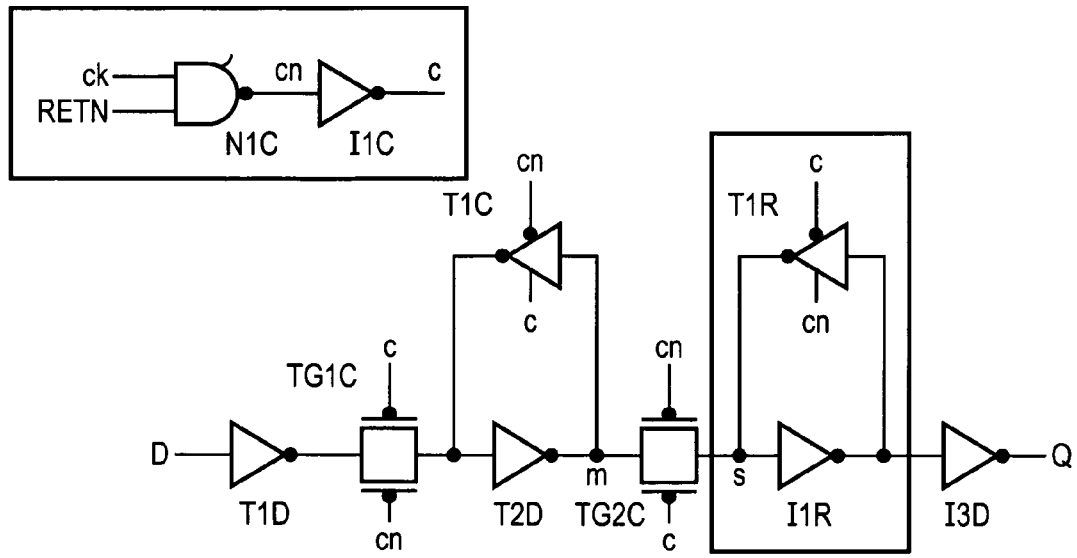
FIGS. 1 and 2 schematically illustrate prior art master-slave flip-flop circuits.
Figure 2:
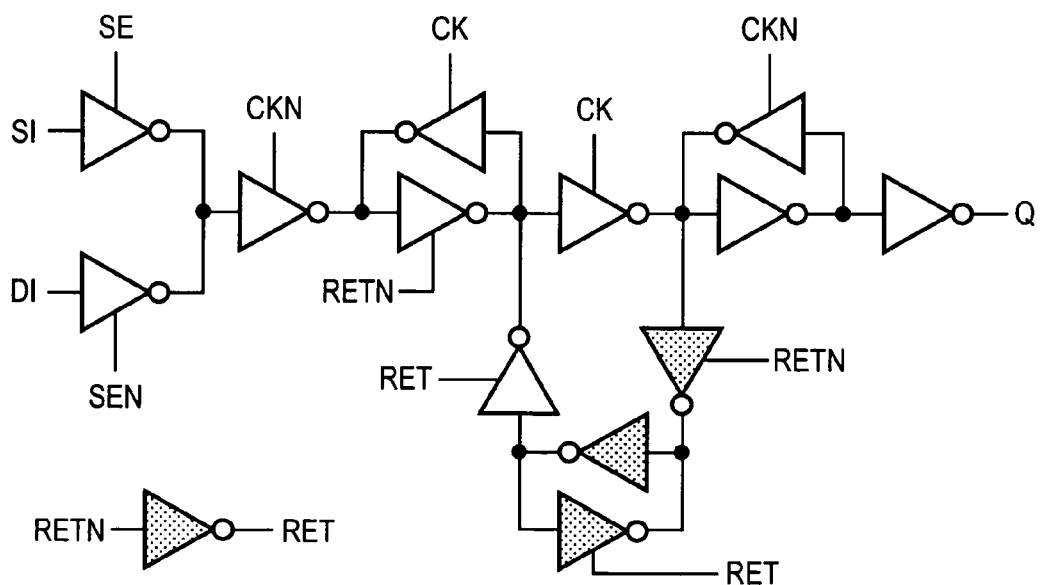

FIGS. 3 to 6 schematically illustrate a master-slave flip-flop circuit 2 (the "flip-flop"). The flip-flop 2 is a D flip-flop with a clock independent retention function. The flip-flop 2 receives as inputs an input signal D, a clock signal CK, and a retention signal RETN. In response to these signals, the flip-flop 2 output an output signal Q.

The clock signal CK controls the operation of the flip-flop 2. The clock signal has a first phase and a second phase. In the examples described below, the first phase occurs when the clock signal CK=0, while the second phase occurs when the clock signal CK=1, but it will be appreciated that it would also be possible to implement a circuit with a first clock phase CK=1 and a second clock phase CK=0. Clock generation circuitry 10 comprises inverters I1C, I2C for successively inverting the clock signal CK to generate a negative clock signal cn and positive clock signal c having opposite signal values. The transistors of the flip-flop 2 are controlled in response to the negative and positive clock signals cn, c.

The flip-flop 2 has a normal mode of operation and a retention mode of operation. The current mode of operation is controlled in dependence on retention signal RETN. Retention signal generation circuitry 12 is provided comprising an inverter I2R configured to invert the retention signal RETN to generate a complementary retention signal ret. The retention signals RETN, ret are used to control the transistors of the flip-flop 2. In the following examples, the flip-flop 2 operates in the normal mode while the retention signal RETN=1, and operates in the retention mode while the retention signal RETN=0. However, the flip-flop design can easily be modified to accommodate a RETN signal of opposite polarity if desired.

The flip-flop 2 comprises an input isolation circuit T1R, a master stage 4, a slave stage 6 and a retention stage 8.

Power control circuitry 14 is provided to supply power to the flip-flop circuit 2. The power control circuitry 14 powers the retention stage 8 independently from the master and slave stages 4, 6 so that the retention stage 8 can remain powered while the master and slave stages 4, 6 are in a power saving state. For example, the power control circuitry 14 may provide power to separate power lines VDD, VDDRET corresponding to the master/slave stages 4, 6 and the retention stage 8 respectively. For conciseness, the power control circuitry 14 has not been illustrated in every Figure, but it will be appreciated that the power control circuitry 14 may sill be provided in each example.

Figure 3:
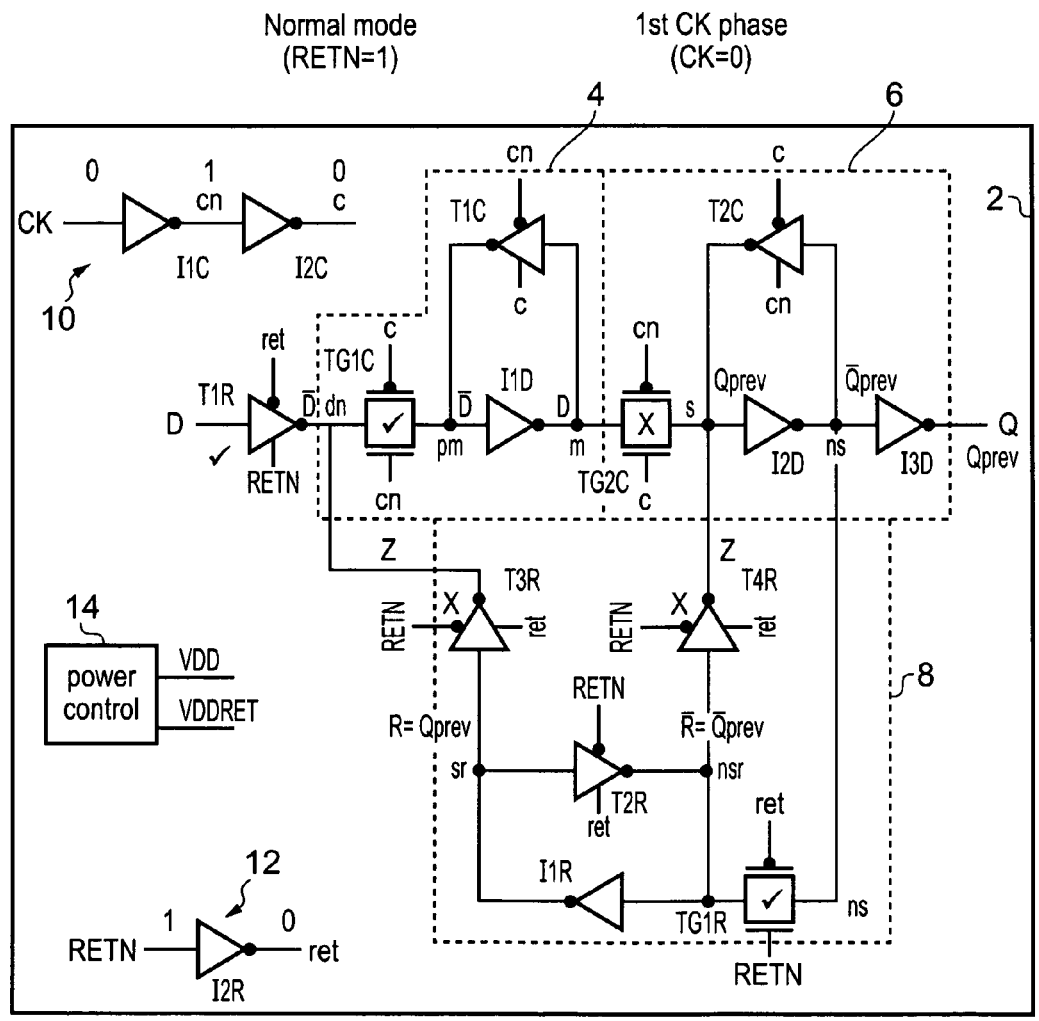
FIGS. 3 to 6 schematically illustrate an embodiment of a master-slave flip-flop circuit.
Figure 4:
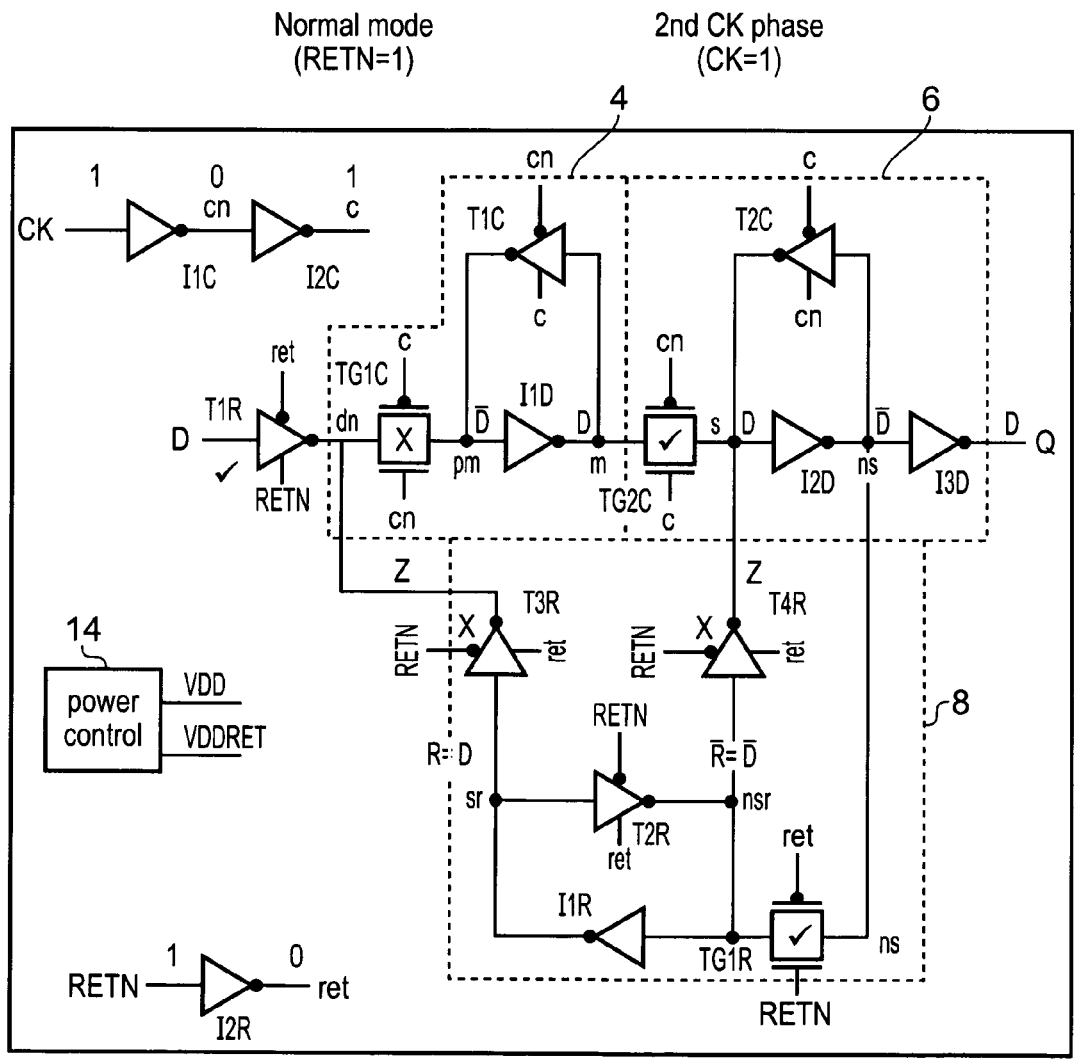

The input isolation circuit comprises a tri-state inverter T1R whose impedance state is controlled in dependence on the retention signal RETN. As shown in FIGS. 3 and 4, during the normal mode (RETN=1), the tri-state inverter T1R operates in a low-impedance mode and inverts the state of input signal D to drive node do of the master stage 4 with the inverted input signal $\overline{D}$.

The master stage 4 comprises a transmission gate TG1C and a pair of inverters T1C, I1D each having their output coupled to the other inverter's input so as to form a master latch. During the normal mode, the transmission gate TG1C is controlled by the clock signals cn, c to be conductive during the first clock phase (CK=0) and non-conductive during the second clock phase (CK=1).

The slave stage 6 comprises master-slave isolation circuitry TG2C, a pair of inverters I2D, T2C coupled to form a slave latch, and an output inverter I3D. The master-slave isolation circuitry comprises a transmission gate TG2C which is responsive to the clock signals c, en to be non-conductive during the first clock phase (CK=0) and conductive during the second clock phase (CK=1).

As shown in FIG. 3, during the first clock phase in the normal mode the master stage 4 receives the inverted input signal $\overline{D}$ from node dn and captures complementary versions of a master signal D, $\overline{D}$ at master nodes m and pm. The master signal has a value corresponding to the input signal D. Also, the master-slave isolation circuitry TG2C isolates the slave stage from changes in the master signal at master node m so that slave stage retains, at the slave nodes s, ns, complementary versions of a previous slave signal $Q_{prev}$, $\overline{Q}_{prev}$ captured by the slave stage 6 in a previous clock cycle.

As shown in FIG. 4, during the second clock phase in the normal mode, the transmission gate TG1C isolates the master stage 4 from changes in the input signal, so that the complementary versions of the master signal D, $\overline{D}$ at nodes m, pm retain their previous value irrespective of changes in the input signal D. Meanwhile, the master-slave isolation circuitry TG2C propagates the master signal D, $\overline{D}$ from the master stage 4 to the slave stage 6 so that the slave stage 6 captures a new slave signal with complementary values D, $\overline{D}$ at slave nodes s, ns corresponding to the value of the master signal.

During both the first and second clock phases, the output inverter I3D inverts the slave signal value at node ns and outputs the inverted value as the output signal Q.

The retention stage 8 comprises retention input circuitry TG1R, a pair of retention inverters I1R, T2R each having their output coupled to the other inverter's input to form a retention latch, master restore output circuitry T3R, and slave restore output circuitry T4R. The retention input circuitry TG1R comprises a transmission gate responsive to the retention signals RETN, ret to operate in a conductive state during the normal mode and a non-conductive state during the retention mode. Master restore output circuitry T3R and slave restore output circuitry T4R comprise tri-state inverters configured to operate in a high-impedance state during the normal mode and a low-impedance state during the retention mode. The output of master restore output circuitry T3R is coupled to master restore node dn of the master stage 4, and the output of slave restore output circuitry T4R is coupled to slave restore nodes of the slave stage 6.

Hence, during the normal mode (during both the first clock phase and the second clock phase), the retention input circuitry TG1R propagates the slave signal from the ns node of the slave stage 6 to the inverters I1R, T2R of the retention stage 8 (see FIGS. 3 and 4). The inverters I1R, T2R capture complementary versions of a retention signal R, $\overline{R}$ at retaining nodes sr, nsr. The retention signal R, $\overline{R}$ has a value dependent on the slave signal. During the normal mode (RETN=1), the master and slave restore output circuitry T3R, T2R output a high-impedance signal Z. The high-impedance level signal Z is at neither a low state nor a high state, but mimics the condition which would exist if the connection from the output of inverters T3R, T2R to nodes dn, s were removed. Hence, during the normal mode the state of the master and slave stages 4, 6 is not affected by the signals retained by the retention latch 8.

Figure 5:
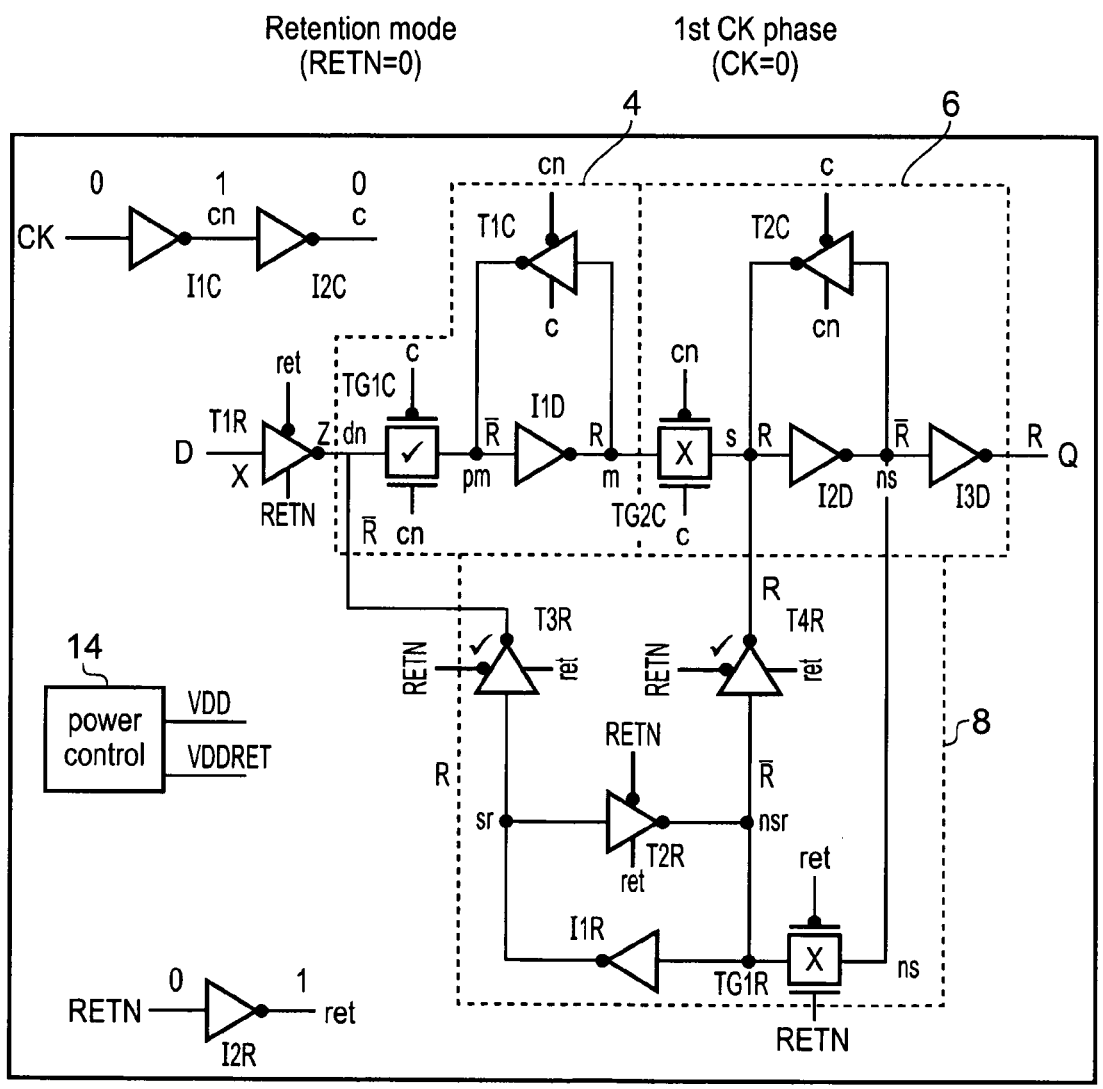
Figure 6:
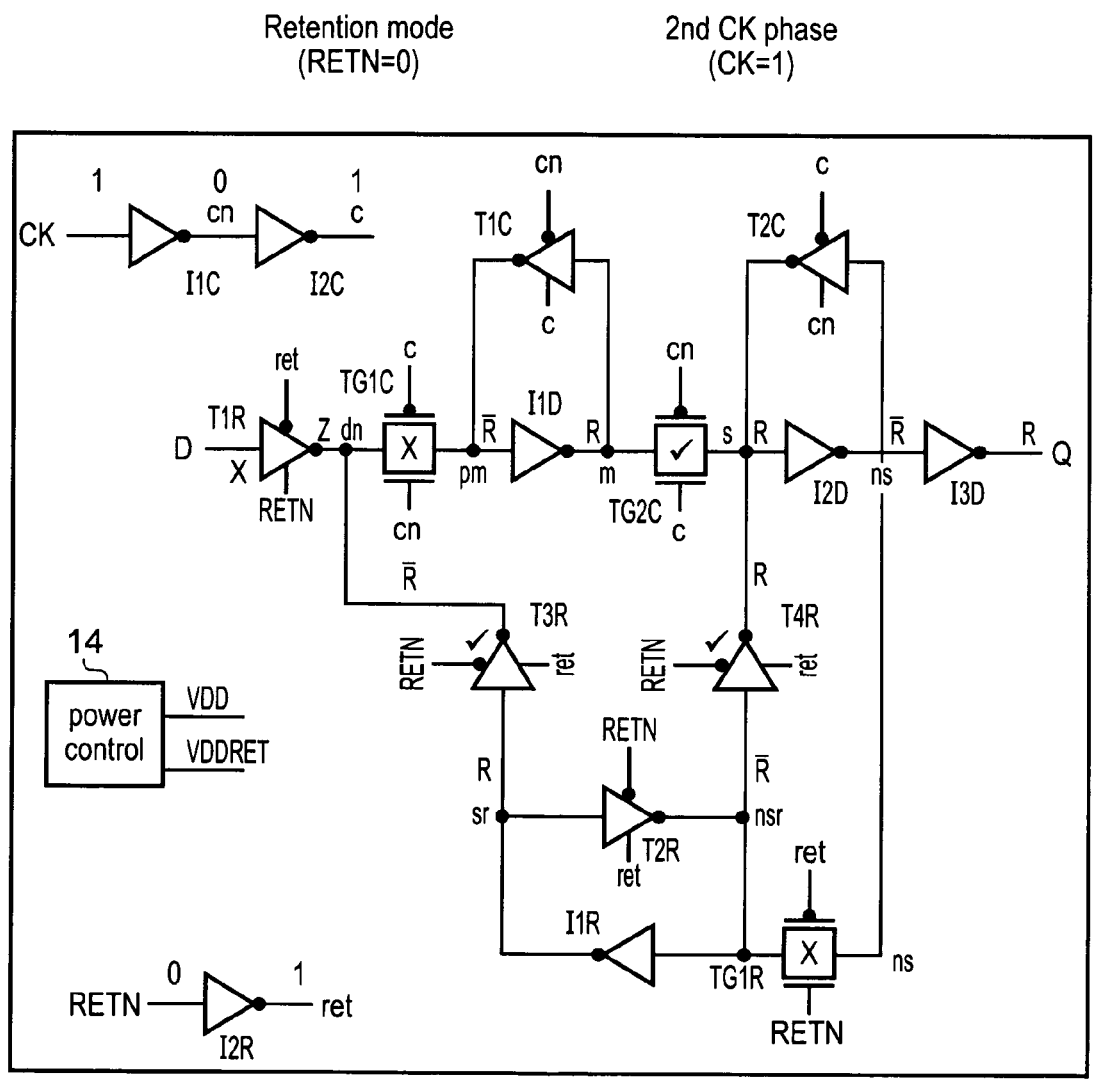

As shown in FIGS. 5 and 6, during the retention mode (RETN=0) the retention input circuitry TG1R isolates the retention stage 8 from changes in the slave signal at node ns. The inverters I1R, T2R of the retention stage 8 continue to retain the retention signal R, $\overline{R}$ irrespective of the state of the master and slave stages 4, 6. Hence, the master and slave stages 4, 6 can be placed in a power saving state by power control circuitry 14 in order to reduce power consumption. The power control circuitry 14 waits for a short period after entering the retention mode before placing the master stage 4 and slave stage 6 in the power saving state, to ensure that the gate TG1R is non-conductive before the slave stage has been powered down.

Also, the master restore output circuitry DR outputs a master restore signal $\overline{R}$ to node dn of the master stage 4, and the slave restore output circuitry T4R outputs a slave restore signal R to node s of the slave stage 6. The master and slave restore signals $\overline{R}$, R have values dependent on the retention signal retained by inverters I1R, T2R. While the master stage 4 and slave stage 6 remain in the power saving state, the master and slave restore signals have no effect.

However, when the power supply to the master stage 4 and slave stage 6 is restored, then the master and slave stages 4, 6 capture the master and slave restore signals so that the master signal at nodes m, pm, the slave signal at nodes s, ns, and the output signal Q return to the values which these signals had at the time when the retention signal R, $\overline{R}$ was captured by the retention stage 8 before entry into the retention mode. The flip-flop 2 can now return to the normal mode of operation with its previous signal values restored. To ensure that the state of the master stage 4 and slave stage 6 has already been restored on returning to the normal mode, the power control circuitry 14 controls the power supply VDD to the master stage 4 and slave stage 6 so that the master stage 4 and slave stage 6 are brought out of the power saving state before the flip-flop 2 returns to the normal mode.

During the retention mode, the tri-state inverter T1R of the input isolation circuit to operates in a high-impedance mode to output a high-impedance level signal Z to node dn (see FIGS. 5 and 6). This prevents the output of the inverter T1R conflicting with the output of master restore output circuitry T3R. Hence, during retention mode the node dn is controlled based on the master restore output signal and not the input signal.

As shown in FIGS. 5 and 6, since master and slave restore signals are provided to both the master stage 4 and the slave stage 6, the state of the flip-flop 2 is restored irrespective of whether the clock signal CK is at the first clock phase or the second clock phase at the time of returning from the retention mode to the normal mode.

During the first clock phase (CK=0, FIG. 5), the master signal is restored by the master restore output circuitry T3R passing a master restore signal to the master stage 4 via node dn and gate TG1C, and the slave signal is restored by the slave restore output circuitry T4R passing a slave restore signal to the slave stage 6 via node s.

During the second clock phase (CK=1, FIG. 6), the slave stage 6 is again restored by the slave restore signal passing from slave restore output circuitry T4R to nodes. Since transmission gate TG2C is conductive during the second clock phase, the slave signal is then propagated to the master stage via transmission gate TG2C to restore the master signal in the master stage.

Hence, the retention restore operation is able to restore the master and slave state independently of whether the clock signal is at the first clock phase or second clock phase. This allows the control of the retention signal to be simplified since it is no longer critical which state of the clock signal is active at the time of returning to the normal mode from the retention mode.

Figure 7:
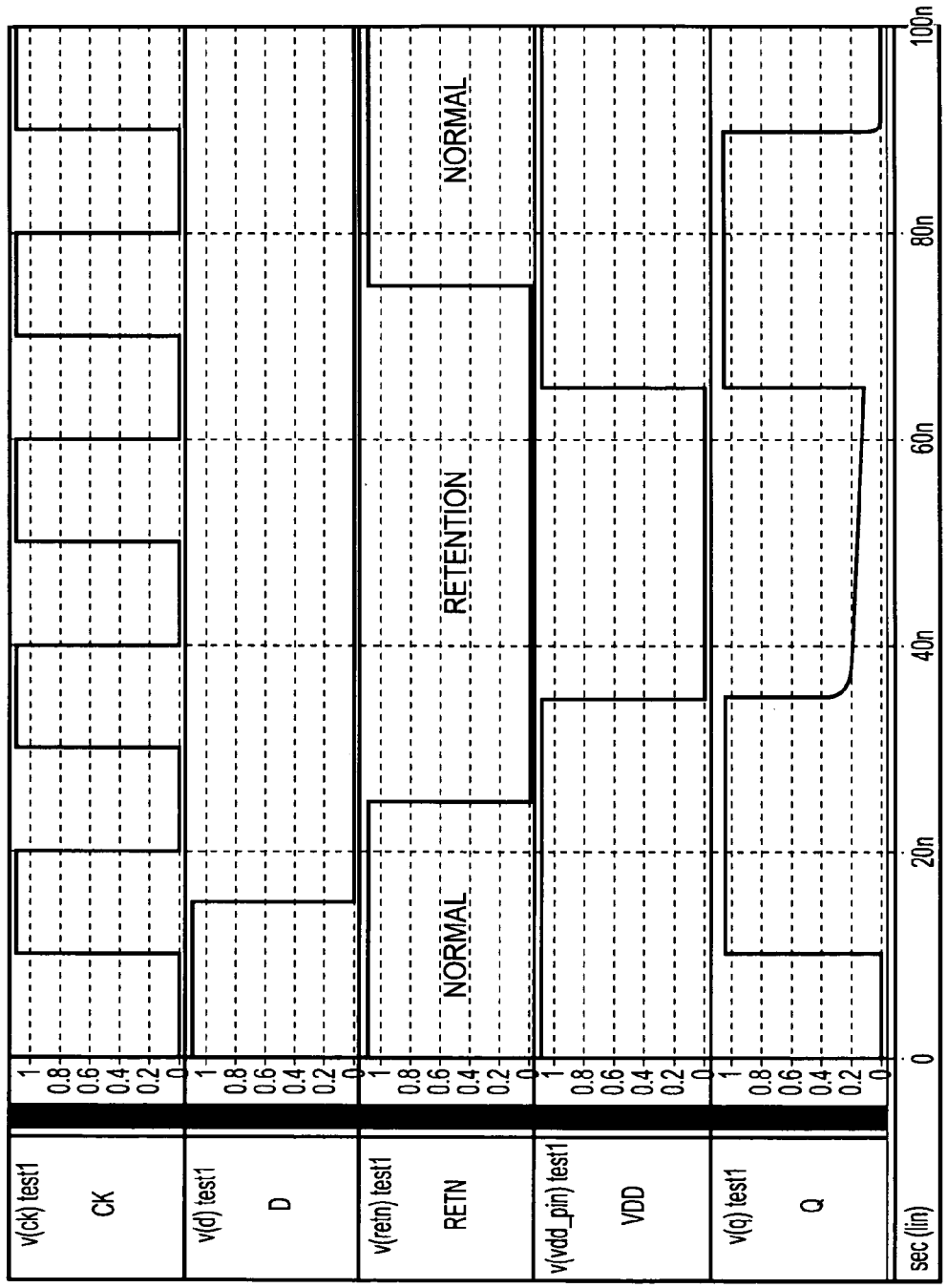
FIGS. 7 to 9 illustrate simulation results for the operation of the embodiment of FIGS. 3 to 6.

FIG. 7 shows an HSPICE simulation of the proposed flip-flop. In this simulation the input D is at a high state and is captured in the slave stage 6 of the flip-flop on the rising edge of the CK (second clock phase) at approximately 8 ns into the simulation. The output of the flip-flop, as seen in the signal Q, transitions to a high state and is in the high state when the retention signal RETN transitions to a low state (approximately 25 ns into the simulation).

Following the transition to retention mode, the common supply voltage VDD is dropped to the master stage 4 and slave stage 6, and the output signal Q transitions to a low state. When the common supply voltage is restored on the VDD supply the state of the retention stage 8 is reflected in the output Q before the retention signal RETN changes to a high state, transitioning the flip-flop to the normal mode.

In the simulation of FIG. 7, the transition of the retention signal RETN to a low state occurs in the first phase of the clock signal CK (CK=0) and the transition of the retention signal RETN to a high state occurs in the second phase of clock signal CK (CK=1). The transition of the supply voltage to a low state occurs in the second phase of the clock signal CK, while the transition of the supply voltage to a high state occurs in the first phase of the clock signal CK.

Figure 8:
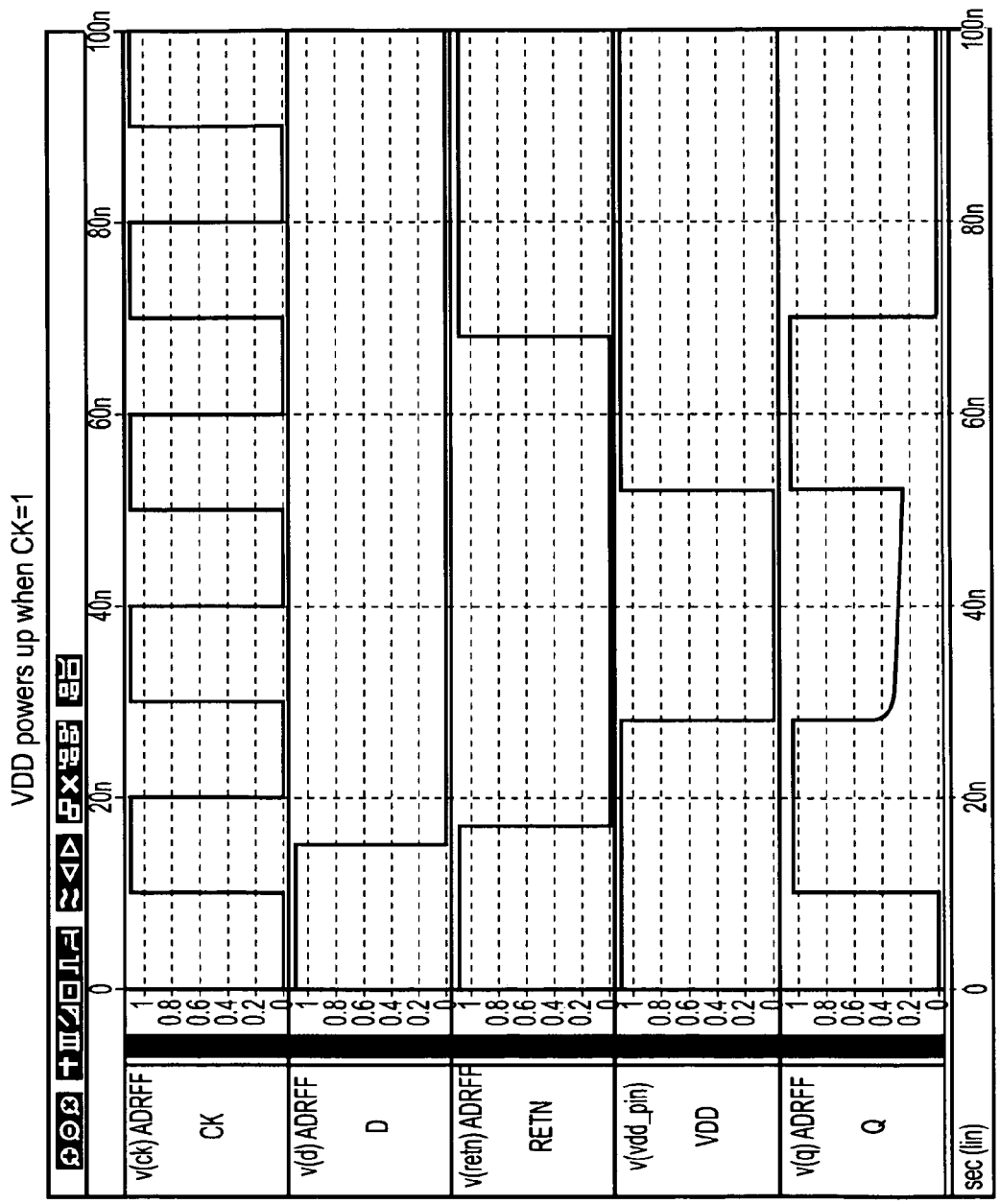

FIG. 8 shows a simulation for the flip-flop with the slave stage 6 capturing a high level input signal (master signal) D on the rising edge of the CK signal at approximately 10 ns into the simulation. At approximately 15 ns into the simulation the input D transitions to a low state, but this transition does not affect the internal state of the flip-flop 2 or the output signal Q because the clock CK is still in the second phase and so transmission gate TG1C is non-conductive. The retention signal RETN then transitions to a low level, causing the flip-flop 2 to enter the retention mode, and subsequently the supply voltage VDD is removed. As in the simulation of FIG. 7, the output Q drops to a low level. At approximately 52 ns into the simulation the VDD voltage is restored on the common supply and the output Q is driven to a high state, reflecting the state of the flip-flop 2 when it entered retention mode. At approximate 68 ns into the simulation the retention signal RETN transitions to a high state and the flip-flop enters the normal mode. On the next rising edge of CK, seen at approximately 69 nss into the simulation, the low state value on the D input is captured in the flip-flop and the output Q transitions to a low state.

In the simulation of FIG. 8, the transition of the retention signal RETN to a low state (entry to retention mode) occurs in the second phase of the clock signal CK (CK=1) and the transition to a high state (return to normal mode) occurs in the first phase of the clock signal CK (CK=0). The transition of the supply voltage VDD to a low state occurs in the first phase of the clock signal CK, while the transition of the supply voltage VDD to a high state occurs in the second phase of the clock signal CK.

Figure 9:
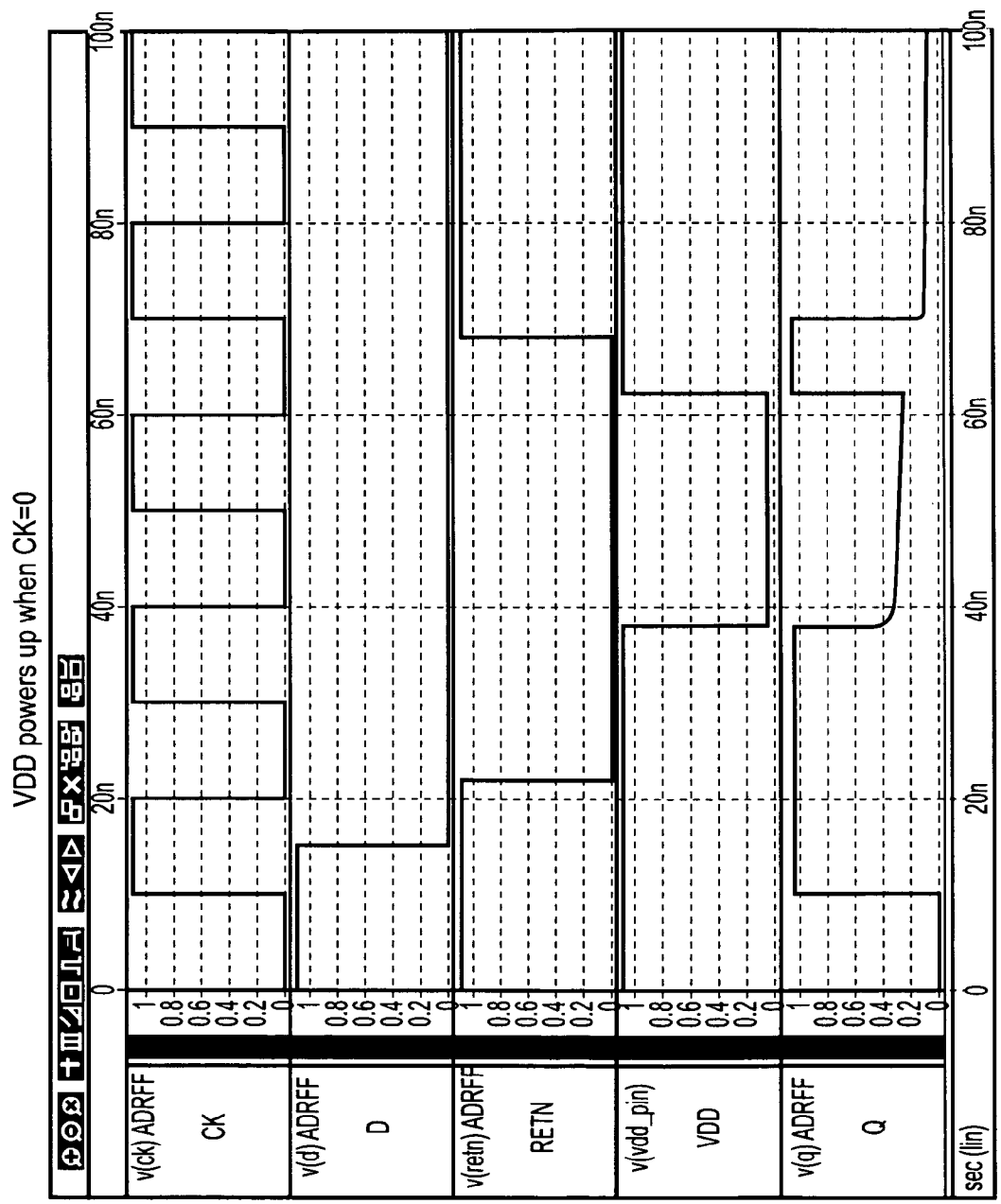

The simulation shown in FIG. 9 is similar to the simulation in FIG. 7. In this simulation the transition of the retention signal RETN to a low state (entry to retention mode) occurs in the first phase of the clock signal CK and the transition to a high state (return to normal mode) also occurs in the first phase of the clock signal CK. The transition of the supply voltage VDD to a low state occurs in the second phase of the clock signal CK, while the transition of the supply voltage VDD to a high state occurs in the first phase of the clock signal CK.

Accordingly, FIGS. 7 to 9 show that the retention capture and restore operations function independently whether the clock signal CK is in the first phase or the second phase at the time of entering retention mode, entering a power saving state, returning to the powered state, and returning to normal mode.

Figure 10:
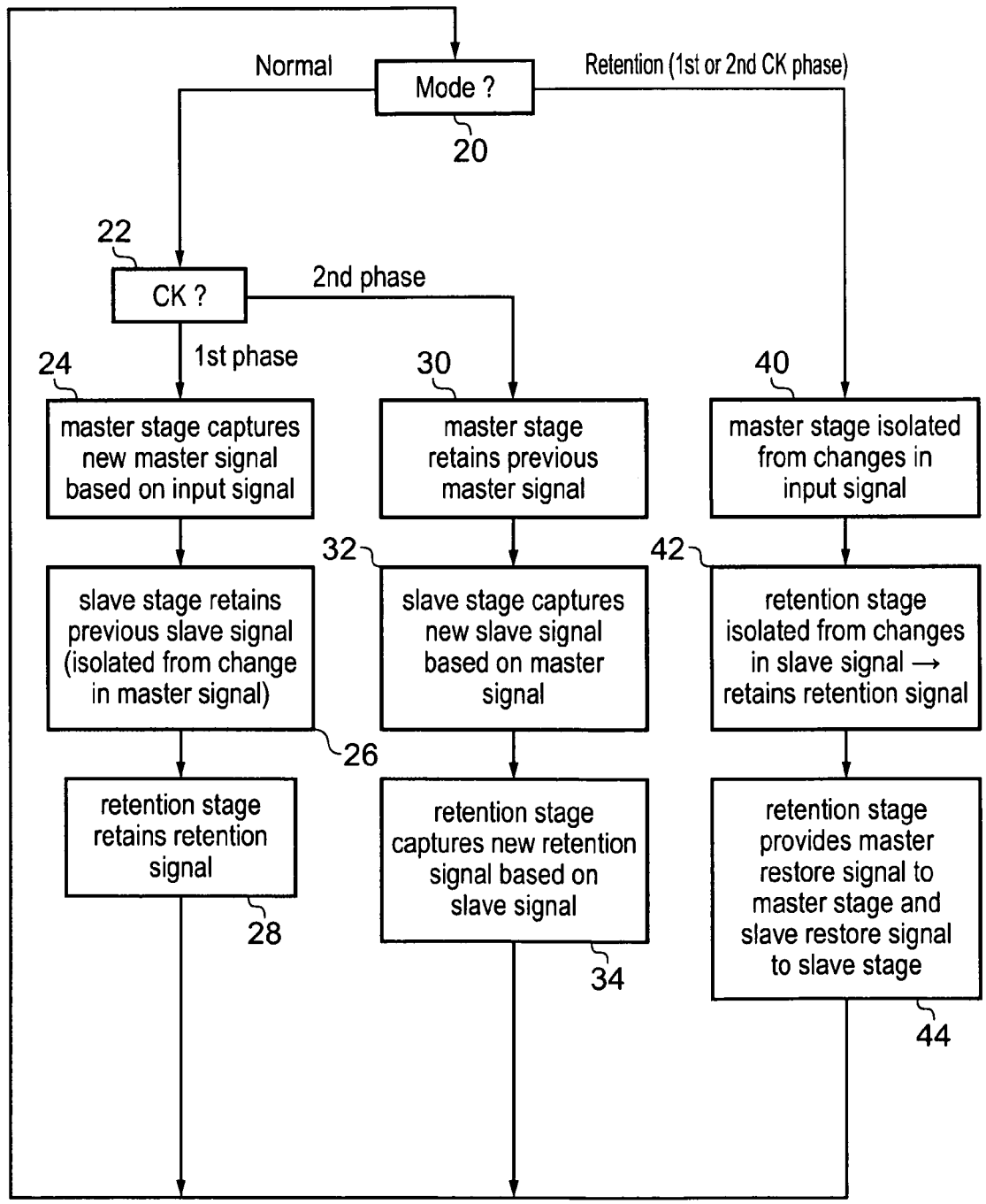
FIG. 10 illustrates a method of operating a master-slave flip-flop circuit.

FIG. 10 schematically illustrates a method of operating the master-slave flip-flop circuit 2. At step 20 it is determined whether the circuit is in the normal mode or the retention mode. During the normal mode, the method proceeds to step 22 where it is determined whether the clock signal CK is in the first phase or the second phase.

During the first phase of the clock signal CK the method proceeds to step 24, where the master stage 4 captures a new master signal in dependence on the current value of the input signal D. At step 26, the slave stage 6 retains its previous slave signal, which is isolated from the change in the master signal by transmission gate TG2C. At step 28, the retention stage retains its retention signal. The method then returns to step 20.

During the second phase of the clock signal CK during the normal mode, the method proceeds from step 22 to step 30, where the master stage retains its previous master signal (at this point, the master stage is isolated from changes in the input signal by transmission gate TG1C). At step 32, the slave stage 6 captures a new slave signal based on the master signal (transmission gate TG2C is conductive so as to propagate the master signal to the slave stage 6). Also, at step 34 the retention stage captures a new to retention signal based on the slave signal, since retention input circuitry (transmission gate) TG1R is conductive during the normal mode. The method then returns to step 20.

On the other hand, during the retention mode the method proceeds from step 20 to step 40 (irrespective of whether the clock signal CK is in the first phase or the second phase). At step 40, the input isolation circuit (tri-state inverter T1R) isolates the master stage 4 from changes in the input signal D. At step 42, the transmission gate TG1R isolates the retention stage 8 from changes in the slave signal at node ns. Hence, the retention stage 8 retains the retention signal. At step 44, the retention stage 8 provides the master restore signal to node dn of the master stage 4 and the slave restore signal to node s of the slave stage 6, so that when the master stage 4 and slave stage 6 are brought out of a power saving state, the flip-flop 2 will reflect the state of the flip-flop 2 at the time of entering retention mode. The method then returns to step 20.

Figure 11:
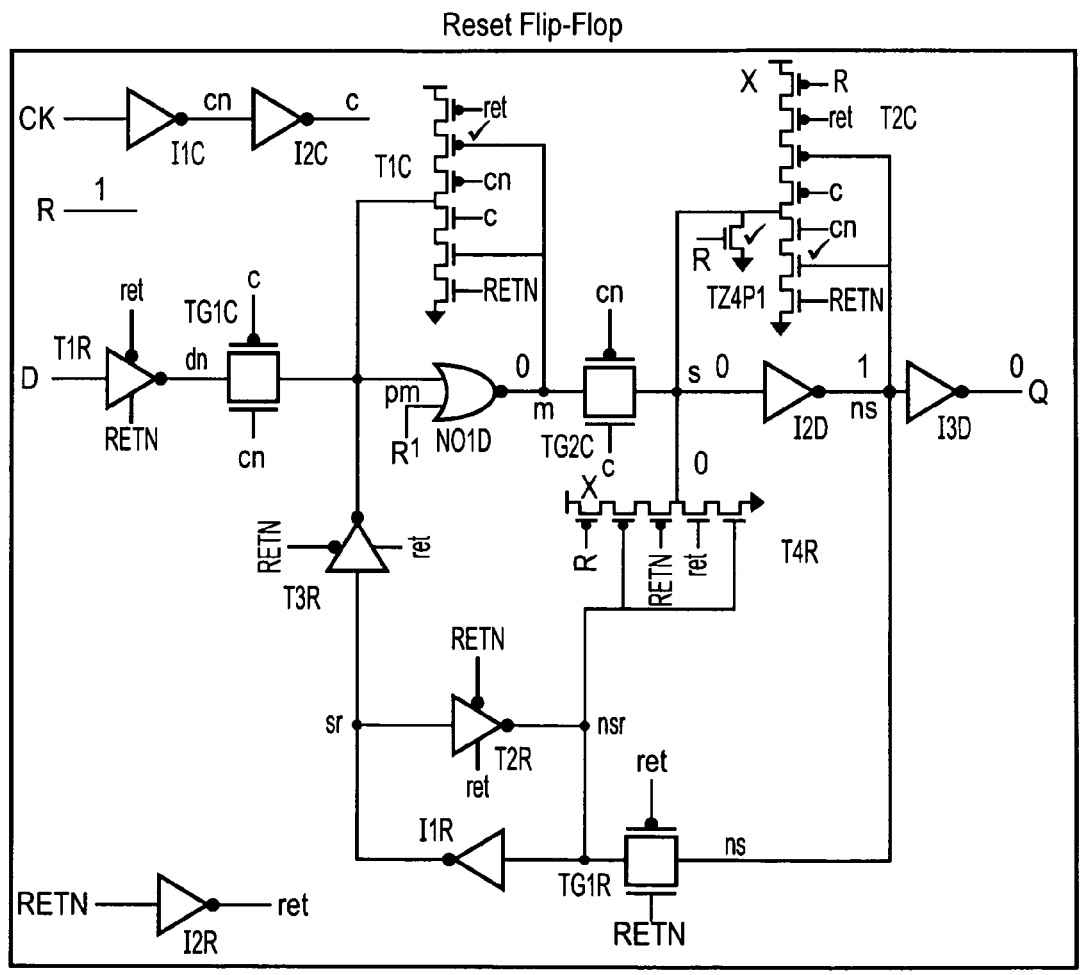
FIGS. 11 to 13 respectively illustrate embodiments of reset, set, and set-reset variants of the master-slave flip-flop circuit of FIGS. 3 to 6, where the retention stage retains its retention signal during a reset or set event.

FIG. 11 shows an embodiment of the flip-flop incorporating an asynchronous reset mechanism. A reset control signal R is provided as an additional input which forces the flip-flop to store and output a low state value (Q=0) when the reset control signal R is asserted. The devices T1C, T2C, and T4R are modified as shown in FIG. 11 to accommodate the reset control signal R, and the inverter I1D is replaced with a NOR gate NO1D.

In the master stage 4, the tri-state inverter T1C is modified to enable the retention signal RETN to force the output of the inverter to a high-impedance state during retention mode to avoid conflicts with the reset operation. Also, the NOR gate NO1D enables the reset control signal R to force a low state into the master latch 4 during a reset operation.

In the slave stage, the inverter T2C is modified in a similar fashion to inverter T1C, and a pull-down transistor TZ4P1 is added to the s node to perform the reset operation on the slave latch. To prevent the slave restore signal from slave restore output circuit T4R conflicting with the reset operation, the slave restore output circuit T4R is also modified to incorporate the reset control signal R to ensure that only a low state signal would be applied to the s node in retention mode during a reset operation.

Also, the master restore output circuit T3R is coupled to node pm of the master stage instead of node dn to allow node pm to be controlled by the master restore signal after the reset control signal returns to R=0 irrespective of the clock phase of the clock signal CK.

When the reset control signal R is in the low state (R=0), then the circuit operates in a similar manner to the circuit of FIGS. 3 to 6. When the reset control signal R is asserted to indicate a reset event (R=1), then the master signal at the master node m, the slave signal at node s, and the output signal Q are all pulled low (Q=0). If the reset event occurs during normal mode, then the retention stage 8 captures the reset slave signal via transmission gate TG1R. However, if the reset event occurs during retention mode, then the transmission gate TG1R is non-conductive, and so the retention stage 8 continues to retain its previously captured retention signal irrespective of the resetting of the master and slave stages 4, 6. This means that if, after the reset control signal has returned to the low state R=0, the circuit returns to the normal mode, then the retention state will be restored to the master and slave stages 4, 6 by the retention stage 8.

Figure 12:
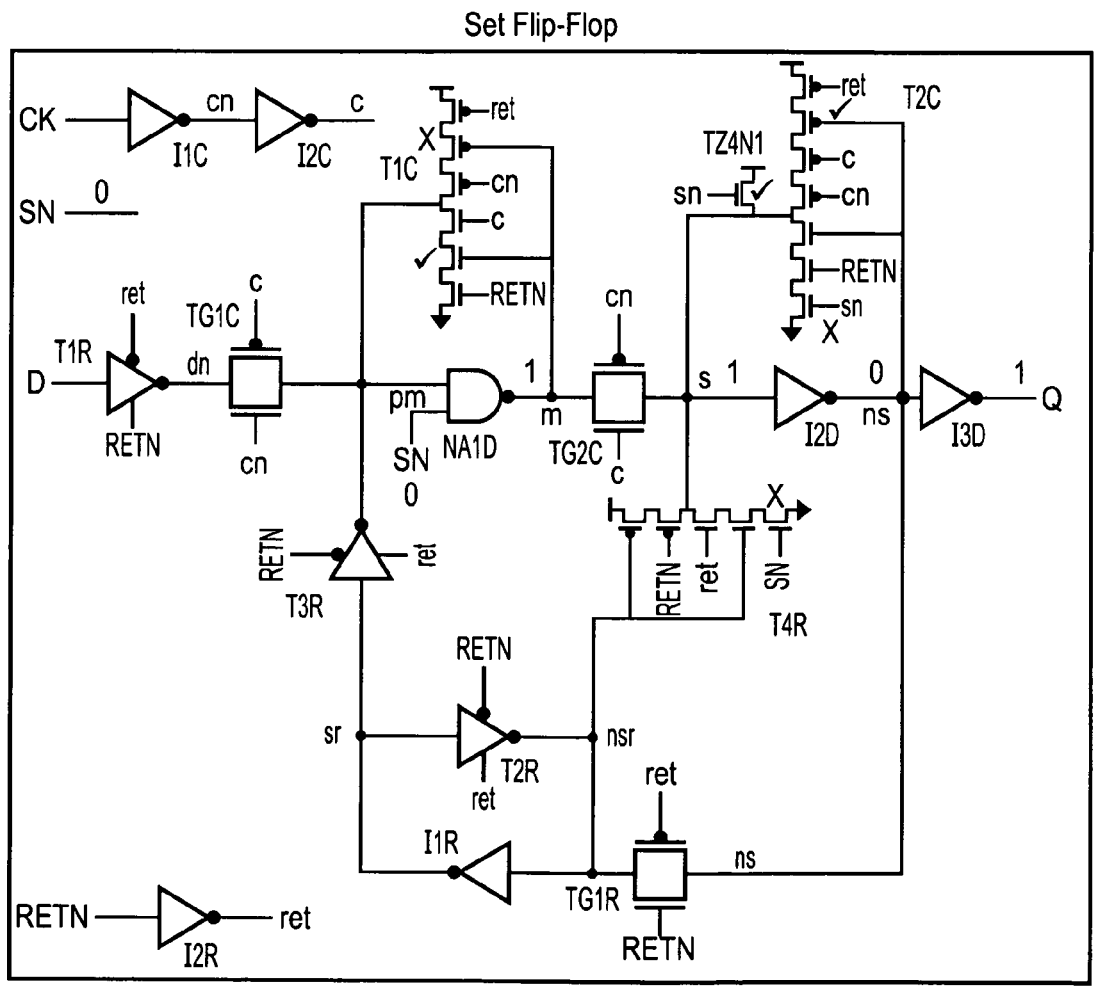

FIG. 12 shows an embodiment of the flip-flop incorporating an asynchronous set mechanism. A set control signal SN is provided as an additional input to force the flip-flop to store and output a high state when the set control signal SN is asserted (the SN signal, in this embodiment, is asserted when a low state value (SN=0) is driven on the SN input). The devices T1C, T2C, and T4R are modified as shown in FIG. 12 to accommodate the SN signal and the inverter I1D is replaced with a NAND gate NA1D. The tri-state inverter T1C of the master stage is modified to enable the retention signal RETN to force the output of the inverter to a high-impedance state during retention mode to avoid conflicts with the set operation. The inverter T2C of the slave stage is modified in a similar fashion, and a pull-up transistor TZ4N1 is added to the s node to perform the set operation on the slave stage 6. The slave restore output controller T4R is also modified to incorporate the SN signal to ensure that only a high state signal can be applied to the s node in retention mode during a set operation. The NAND gate NA1D enables the SN signal to force a high state into the master latch in a reset operation.

When the set control signal SN is not asserted (SN=1), then the flip flop circuit to of FIG. 12 operates in a similar manner to the circuit of FIGS. 3 to 6. When the set control signal SN is asserted to indicate a set event (SN=0), then the master signal at the master node m, the slave signal at node s, and the output signal Q are all pulled high (Q=1). If the set event occurs during normal mode, then the retention stage 8 captures the set slave signal via transmission gate TG1R. However, if the set event occurs during retention mode, then the transmission gate TG1R is non-conductive, and so the retention stage 8 continues to retain its previously captured retention signal irrespective of the setting of the master and slave stages 4, 6. This means that it after the set control signal has returned to the high state SN=1, the circuit returns to the normal mode, then the retention state will then be restored to the master and slave stages 4, 6 by the retention stage 8.

Figure 13:
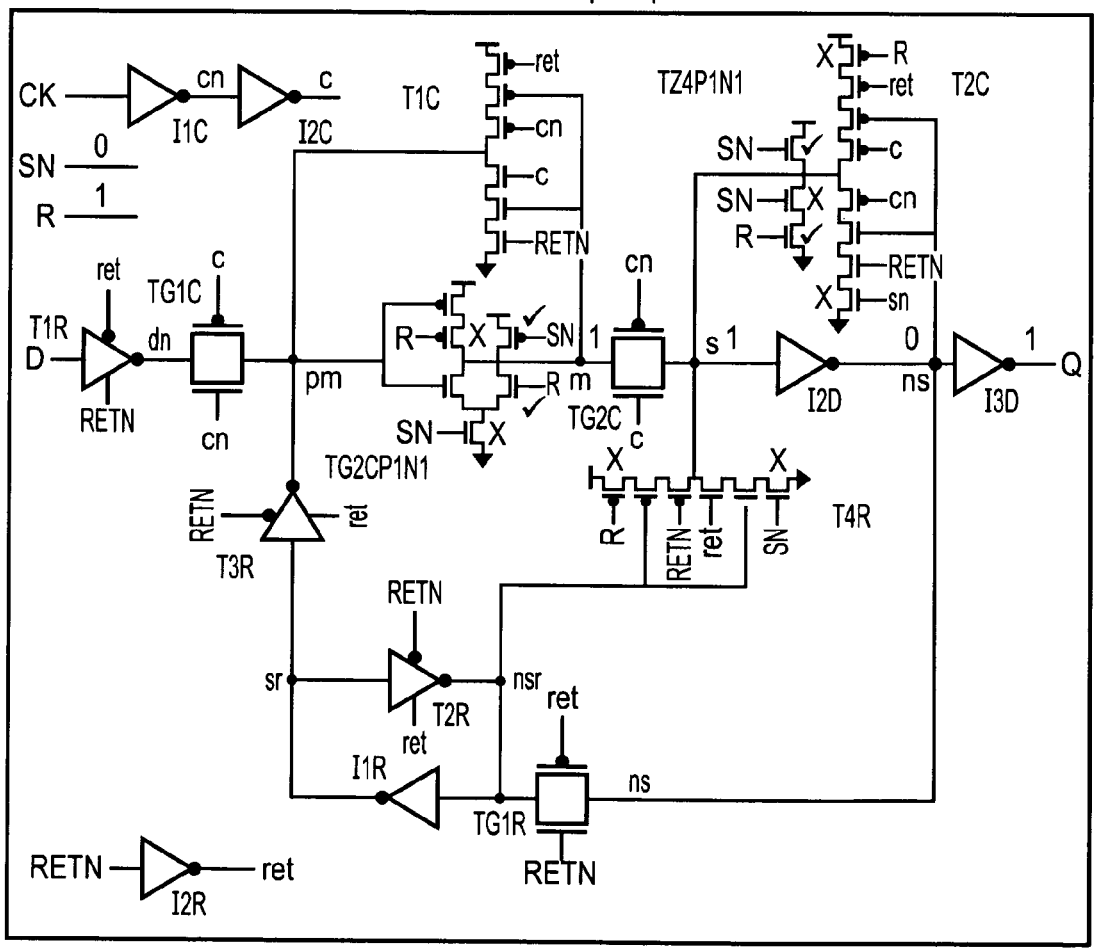

FIG. 13 shows an embodiment of the flip-flop incorporating both set and reset functions. As in the set and reset embodiments above, the inverter T1C of the master stage is modified to enable the retention signal RETN to force the output of the inverter to a high-impedance state in retention mode. The inverter T2C inverter of the slave stage is modified to respond to both the set control signal SN and the reset control signal R. In this embodiment, the set operation has a higher priority than the reset operation, but other embodiments may reverse this priority and favour the reset operation. The T2C inverter and device TZ4P1N1 will force a high state on the s node when the set control signal SN is asserted (SN=0), and will force a low state on node s when the set control signal SN is not asserted (SN=1) and the reset control signal R is asserted (R=1). Both the SN and R inputs are incorporated in the slave restore output controller T4R to ensure that the controller T4R either drives slave nodes with the same signal value as is sourced by device TZ4P1N1, or is in a high-Z state, during the retention mode. The pass gate TG2C is replaced by a complex gate TG2CP1N1 which will force a high state on master, node m when the set control signal SN is asserted (SN=0) and a low state when the reset control signal R is asserted (R=1) and the set control signal SN is not asserted (SN=1). When neither of the set control signal SN and the reset control signal R is asserted (SN=1), gate TG2CP1N1 inverts the state of node pm and drives node m as in the embodiment of FIGS. 3 to 6.

Again, in the embodiment of FIG. 13, the retention stage 8 retains its signal if the set or reset event occurs during retention mode. Therefore, on return to normal mode the retention state is restored to the master stage 4 and slave stage 6.

Figure 14:
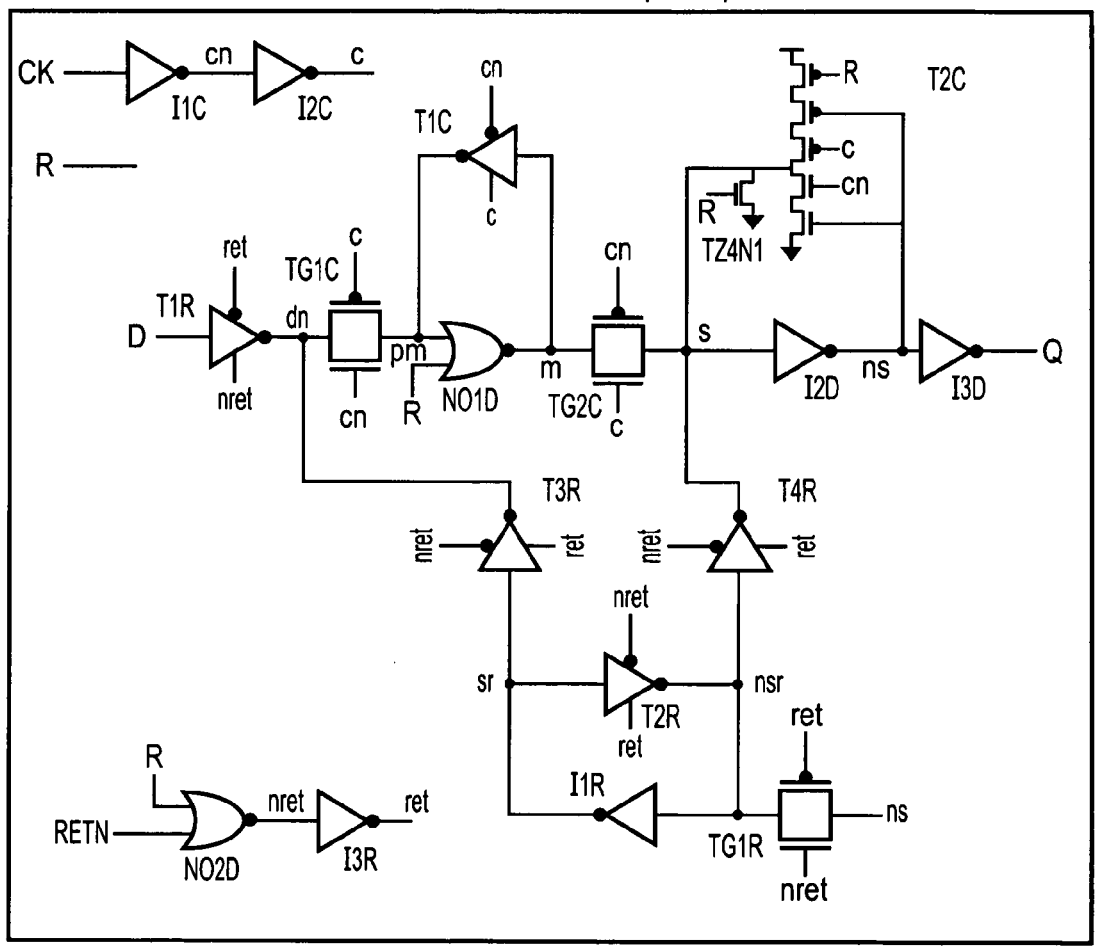
FIGS. 14 to 16 respectively illustrate reset, set and set-reset variants, of the master-slave flip-flop circuit, where the retention stage is reset or set along with the master stage and slave stage during a reset or set event.

FIG. 14 shows a variant of the reset embodiment shown in FIG. 11 in which the state of the retention latch 8 is also forced to a low state when the reset control signal is asserted. In this embodiment, the tri-state inverter T1C is unchanged from the circuit is shown in FIG. 3 and the retention signals RETN, ret signals are not incorporated into the T2C device. Likewise, the tri-state inverter T4R is unchanged with respect to FIG. 1. Hence, the circuit configuration is simpler than in FIG. 11.

In FIG. 14, the inverter I2R of the earlier embodiments is replaced with a NOR gate NO2D which receives as inputs the reset control signal R and the retention signal RETN, and an inverter I3R coupled to the output of the NOR gate NO2D. Signals nret and ret for controlling the transistors of the flip-flop are generated from the outputs of the NOR gate NO2D and inverter I3R (the signal nret is used to control the transistors instead of retention signal RETN as in previous embodiments). During a reset operation, the reset control signal R is asserted (R=1), which causes met to transition to a low value, driving the flip-flop out of retention mode into normal mode. This causes transmission gate TG1R to become conductive, and so the slave signal value at the ns node (which has been reset in response to the reset event by devices T2C, TZ4N1) is captured in the retention stage, thus resetting the retention state. Hence, retention state is lost during a reset event.

Figure 15:
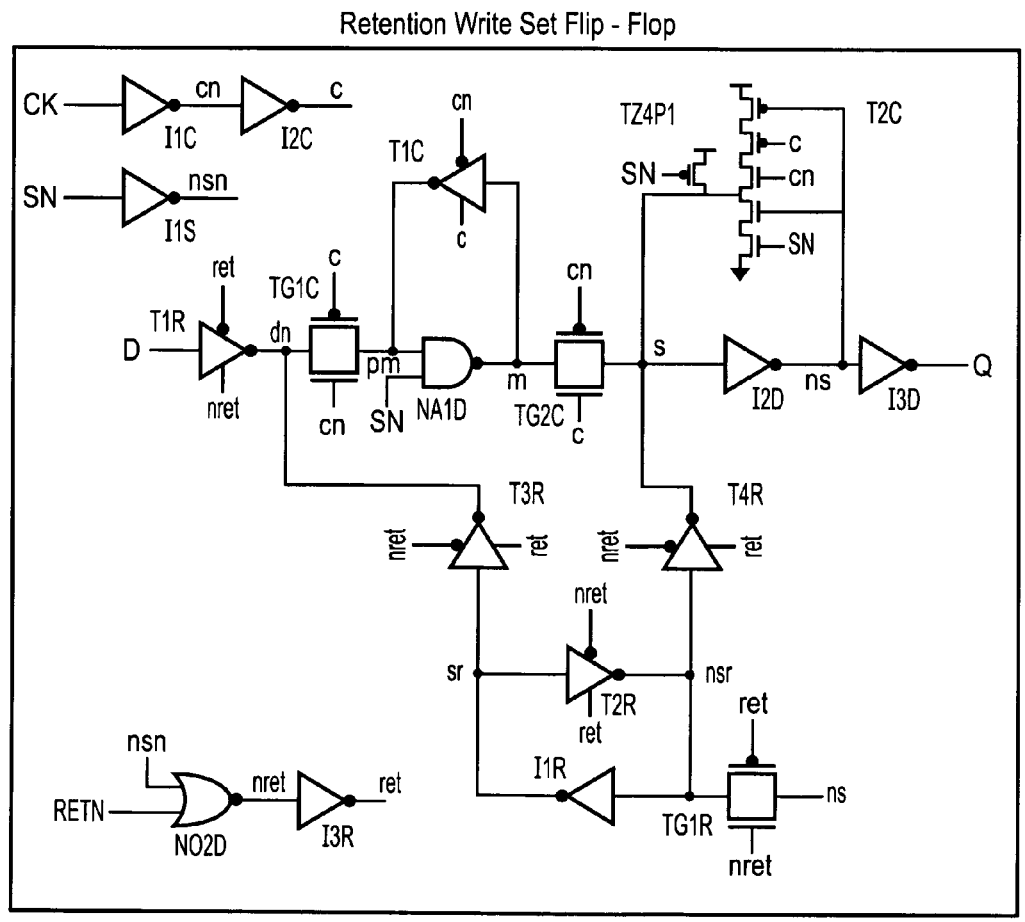
Figure 16:
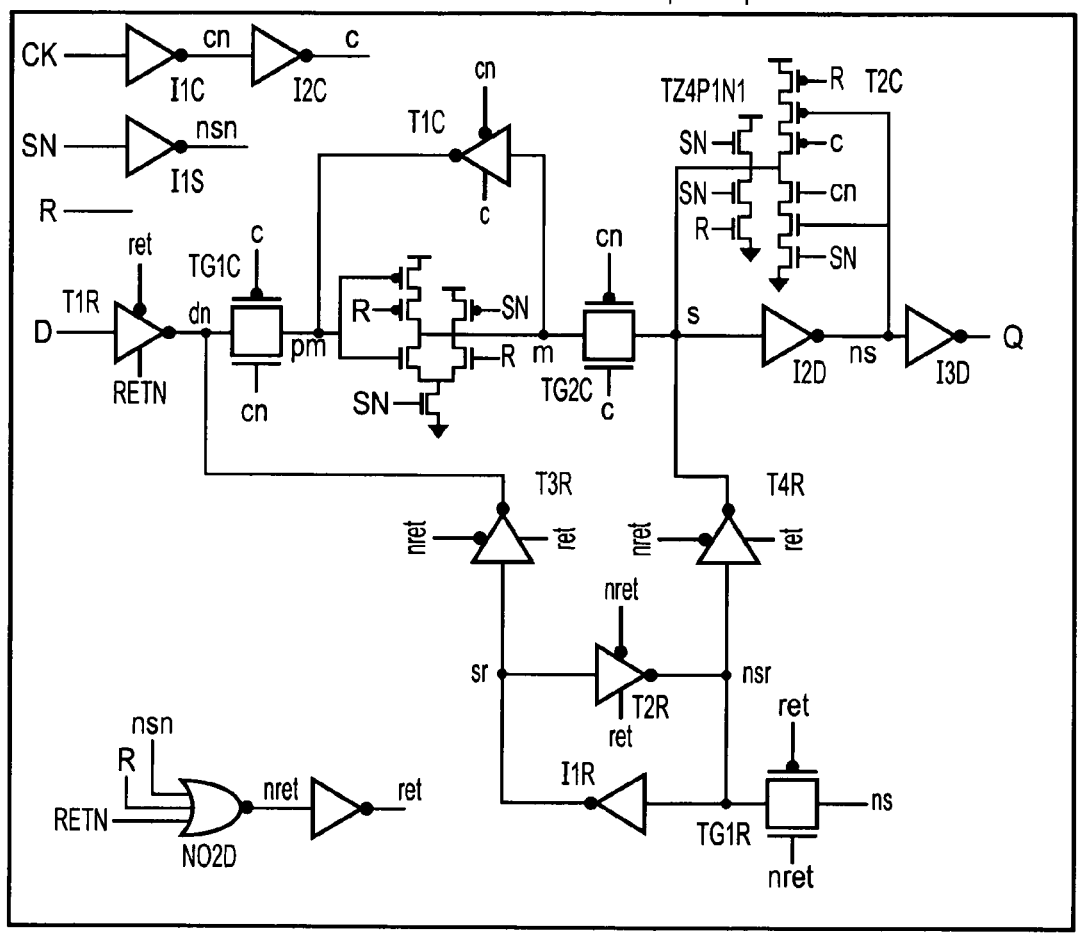

Similarly, FIGS. 15 and 16 show variants of the set embodiment of FIG. 12 and the set-reset embodiment of FIG. 13 respectively, in which a set event or reset event causes the retention state to be overwritten. Again, a NOR gate NO2D is provided to gate the retention signal RETN so as to force the circuit to return to the normal mode when the set event or reset event occurs during retention mode.

Hence, for applications where it is acceptable to lose the state of the retention stage 8 during a reset operation, then the embodiments of FIGS. 14 to 16 may be preferable to the embodiments of FIGS. 11 to 13 in order to reduce the complexity of the circuit. On the other hand, if retention state needs to be retained during reset, then the embodiments of FIGS. 11 to 13 would be preferable.

Figure 17:
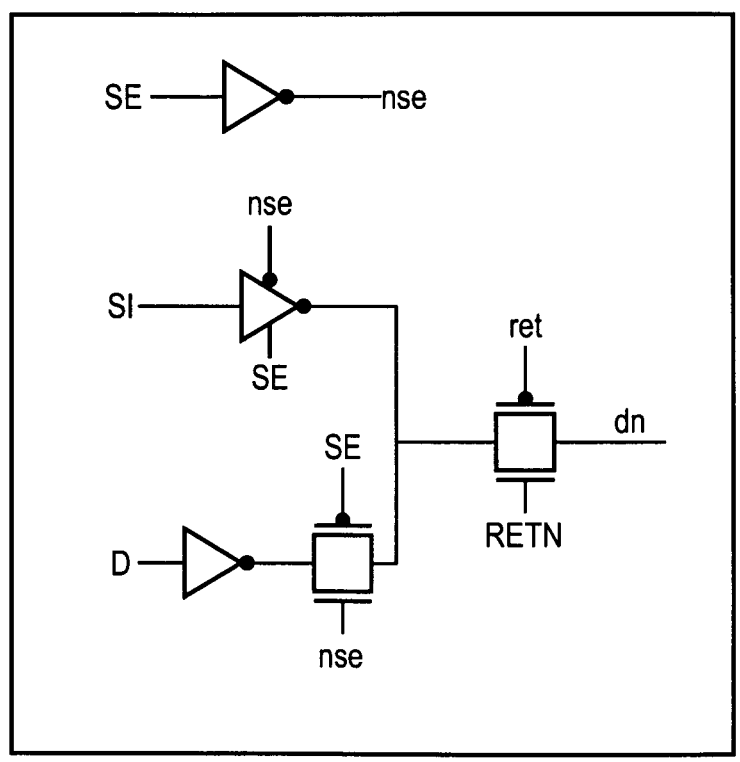
FIG. 17 schematically illustrates an example of an input isolation circuit for use in a circuit having a scan mode.

The input tri-state inverter T1R of previous embodiments may be modified to accommodate scan testing as shown in FIG. 17. A scan enable signal SE controls the scan mode of the flip-flop 2 and when set to a high state forces the input device to be responsive to the scan input (SI) in place of the D input. When the SE input is set to a low state the flip-flop behaves as described previously with the input D being inverted during normal mode and the flip-flop being isolated from the input D during retention mode.

Hence, a flip-flop circuit having the scan-enabled input device shown in FIG. 17 in place of the previously disclosed inverter T1R has three modes of operation: a normal mode (SE=0, RETN=1), a scan mode (SE=1, RETN=1), and a retention mode (SE=X, RETN=0). During normal mode, the master stage is driven in response to the input signal D. During the scan mode, the master stage is driven in response to the scan input signal SI. During the retention mode, the device of FIG. 17 de-couples the master stage from changes in the input signal D and scan input signal SI, so that the master stage can instead be controlled based on the master restore signal from the retention stage.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A master-slave flip-flop circuit for receiving an input signal and for generating an output signal, said master-slave flip-flop circuit being controlled by a clock signal having a first phase and a second phase, said master-slave flip-flop circuit having a normal mode of operation and a retention mode of operation, said master-slave flip flop circuit comprising:

a master stage configured, during said normal mode, to (i) capture a master signal at a master node during said first phase of said clock signal, said master signal having a value dependent on said input signal, and (ii) retain said master signal at said master node during said second phase of said clock signal;

a slave stage configured, during said normal mode, to (i) capture a slave signal at a slave node during said second phase of said clock signal, said slave signal having a value dependent on said master signal, and (ii) retain said slave signal at said slave node during said first phase of said clock signal, said output signal having a value dependent on said slave signal;

an input isolation circuit configured to isolate said master stage from said changes in said input signal during said retention mode; and a retention stage coupled to said master stage and said slave stage and configured:

(i) during said normal mode, to capture a retention signal at a retaining node, said retention signal having a value dependent on said slave signal; and (ii) during said retention mode, to isolate said retaining node from changes in said slave signal, to retain said retention signal at said retaining node, to provide a master restore signal to a master restore node of said master stage and to provide a slave restore signal to a slave restore node of said slave stage, said master restore signal and slave restore signal having values, dependent on said retention signal, for configuring said master stage and said slave stage such that said master signal and said slave signal have values corresponding to said retention signal.

2. The master-slave flip-flop circuit according to claim 1, comprising power control circuitry configured to selectively place at least said master stage and said slave stage in a power saving state during said retention mode.

3. The master-slave flip-flop circuit according to claim 2, wherein said power control circuitry is configured to place at least said master stage and said slave stage in said power saving state after said master-slave flip-flop circuit has entered said retention mode, and to bring said at least said master stage and said slave stage out of said power saving state before said master-slave flip-flop circuit returns to said normal mode.

4. The master-slave flip-flop circuit according to claim 1, wherein said retention stage comprises retention input circuitry configured to propagate changes in said slave signal to said retaining node during said normal mode and to isolate said retaining node from changes in said slave signal during said retention mode.

5. The master-slave flip-flop circuit according to claim 1, wherein said retention stage comprises master restore output circuitry configured to isolate said master restore node from said master restore signal during said normal mode and to propagate said master restore signal to said master restore node during said retention mode.

6. The master-slave flip-flop circuit according to claim 1, wherein said retention stage comprises slave restore output circuitry configured to isolate said slave restore node from said slave restore signal during said normal mode and to propagate said slave restore signal to said slave restore node during said retention mode.

7. The master-slave flip-flop circuit according to claim 1, comprising master-slave isolation circuitry configured, during at least said normal mode, to isolate said slave node from said master node during said first phase of said clock signal and to propagate said master signal from said master node to said slave node during said second phase of said clock signal.

8. The master-slave flip-flop circuit according to claim 1, wherein said input isolation circuit comprises a tri-state inverter configured to operate in a low-impedance state during said normal mode and to operate in a high-impedance state during said retention mode.

9. The master-slave flip-flop circuit according to claim 1, further having a scan mode of operation, wherein said input isolation circuit is configured to:
   (i) propagate changes in said input signal to said master stage during said normal mode;
   (ii) propagate changes in a scan input signal to said master stage during said scan mode such that said master signal has a value dependent on said scan input signal; and
   (iii) isolate said master stage from changes in said input signal and said scan input signal during said retention mode.

10. The master-slave flip-flop circuit according to claim 1, comprising a reset mechanism configured to receive a reset control signal and, in response to said reset control signal indicating a resetting event, to reset said master signal and said slave signal to values such that said output signal has a low logic value.

11. The master-slave flip-flop circuit according to claim 10, wherein said retention stage is configured to retain said retention signal when said reset control signal indicates said resetting event during said retention mode.

12. The master-slave flip-flop circuit according to claim 11, wherein said retention stage is configured, in response to said reset control signal indicating said resetting event during said retention mode, to prevent said slave stage from being reconfigured in response to said slave restore signal.

13. The master-slave flip-flop circuit according to claim 10, wherein said retention stage is configured to reset said retention signal to a reset value when said reset control signal indicates said resetting event during said retention mode.

14. The master-slave flip-flop circuit according to claim 13, wherein said flip-flop circuit is configured to return to said normal mode if said reset control signal indicates said resetting event while said flip-flop circuit is operating in said retention mode.

15. The master-slave flip-flop circuit according to claim 1, comprising a set mechanism configured to receive a set control signal and, in response to said set control signal indicating a setting event, to set said master signal and said slave signal to values such that said output signal has a high logic value.

16. The master-slave flip-flop circuit according to claim 10, wherein said retention stage is configured to retain said retention signal when said set control signal indicates said setting event during said retention mode.

17. The master-slave flip-flop circuit according to claim 15, wherein said retention stage is configured, in response to said set control signal indicating said setting event during said retention mode, to prevent said slave stage from being reconfigured in response to said slave restore signal.

18. The master-slave flip-flop circuit according to claim 15, wherein said retention stage is configured to set said retention signal to a set value when said set control signal indicates said setting event during said retention mode.

19. The master-slave flip-flop circuit according to claim 18, wherein said flip-flop circuit is configured to return to said normal mode if said set control signal indicates said setting event while said flip-flop circuit is operating in said retention mode.

20. The master-slave flip-flop circuit according to claim 10, further comprising a set mechanism configured to receive a set control signal and, in response to said set control signal indicating a setting event, to set said master signal and said slave signal to values such that said output signal has a high logic value;
   wherein one of said set mechanism and said reset mechanism takes precedence over the other of said set mechanism and said reset mechanism such that if said set control signal indicates said setting event simultaneously with said reset control signal indicating said resetting event, then said master signal and said slave signal are set to said values such that said output signal has a logic value corresponding to said one of said set mechanism and said reset mechanism.

21. A master-slave flip-flop circuit for receiving an input signal and for generating an output signal, said master-slave flip-flop circuit being controlled by a clock signal having a first phase and a second phase, said master-slave flip-flop circuit having a normal mode of operation and a retention mode of operation, said master-slave flip flop circuit comprising:
   master stage means for, during said normal mode, (i) capturing a master signal at a master node during said first phase of said clock signal, said master signal having a value dependent on said input signal, and (ii) retaining said master signal at said master node during said second phase of said clock signal;
   slave stage means for, during said normal mode, (i) capturing a slave signal at a slave node during said second phase of said clock signal, said slave signal having a value dependent on said master signal, and (ii) retaining said slave signal at said slave node during said first phase of said clock signal, said output signal having a value dependent on said slave signal;
   input isolation means for isolating said master stage means from said changes in said input signal during said retention mode; and
   retention stage means, coupled to said master stage means and said slave stage means, for:
   (i) during said normal mode, capturing a retention signal at a retaining node, said retention signal having a value dependent on said slave signal; and
   (ii) during said retention mode, isolating said retaining node from changes in said slave signal, retaining said retention signal at said retaining node, providing a master restore signal to a master restore node of said master stage means and providing a slave restore signal to a slave restore node of said slave stage means, said master restore signal and slave restore signal having values, dependent on said retention signal, for configuring said master stage means and said slave stage means such that said master signal and said slave signal have values corresponding to said retention signal.

22. A method of operating a master-slave flip-flop circuit for receiving an input signal and for generating an output signal, said master-slave flip-flop circuit being controlled by a clock signal having a first phase and a second phase, said master-slave flip-flop circuit having a normal mode of operation and a retention mode of operation, said method comprising:
   (i) during said normal mode of operation:
      (a) capturing a master signal at a master node of a master stage during said first phase of said clock signal, said master signal having a value dependent on said input signal,
      (b) retaining said master signal at said master node during said second phase of said clock signal;

(c) capturing a slave signal at a slave node of a slave stage during said second phase of said clock signal, said slave signal having a value dependent on said master signal;
(d) retaining said slave signal at said slave node during said first phase of said clock signal, said output signal having a value dependent on said slave signal; and
(e) capturing a retention signal at a retaining node of a retention stage, said retention signal having a value dependent on said slave signal; and (ii) during said retention mode of operation:
(a) isolating said master stage from said changes in said input signal during said retention mode;
(b) isolating said retaining node from changes in said slave signal;
(c) retaining said retention signal at said retaining node;
(d) providing a master restore signal to a master restore node of said master stage; and
(e) providing a slave restore signal to a slave restore node of said slave stage;
said master restore signal and slave restore signal having values, dependent on said retention signal, for configuring said master stage and said slave stage such that said master signal and said slave signal have values corresponding to said retention signal.

* * * * *